(12) United States Patent
Losio et al.

(10) Patent No.: US 8,778,464 B2
(45) Date of Patent: Jul. 15, 2014

(54) METHOD OF REMOVING CONTAMINATION FROM A REACTOR

(75) Inventors: Paolo Losio, Pfäffikon (CH); Oliver Kluth, Walenstadt (CH); Jiri Kalas, Amden (CH)

(73) Assignee: Tel Solar AG, Trubbach (CH)

( * ) Notice: Subject to any disclaimer, the term of this patent is extended or adjusted under 35 U.S.C. 154(b) by 250 days.

(21) Appl. No.: 12/917,588

(22) Filed: Nov. 2, 2010

(65) Prior Publication Data

US 2011/0104399 A1    May 5, 2011

Related U.S. Application Data

(60) Provisional application No. 61/257,967, filed on Nov. 4, 2009.

(51) Int. Cl.
*H05H 1/24* (2006.01)

(52) U.S. Cl.
USPC ........ 427/569; 427/248.1; 427/576; 427/578; 134/4; 134/22.1

(58) Field of Classification Search
USPC .................... 427/569, 576, 578, 248.1; 134/4
See application file for complete search history.

(56) References Cited

U.S. PATENT DOCUMENTS

| 2004/0129671 A1 | 7/2004 | Ji et al. | |
|---|---|---|---|
| 2009/0093080 A1* | 4/2009 | Choi et al. | 438/73 |
| 2009/0208668 A1* | 8/2009 | Choi et al. | 427/569 |

* cited by examiner

*Primary Examiner* — Elizabeth Burkhart
(74) *Attorney, Agent, or Firm* — Pearne & Gordon LLP

(57) ABSTRACT

The present invention provides a method for removing metal and/or metal oxide contamination from the interior of a vacuum coating reactor, the method comprising the steps of: a) performing an idle coating step by depositing a coating layer, wherein the coating layer comprises silicon; b) at least partly removing the deposited coating layer. The method according to the invention is particularly suitable for cleaning reactors in the context of solar cell manufacturing. The method is time saving and cost saving.

11 Claims, 2 Drawing Sheets

METHOD OF REMOVING CONTAMINATION FROM A REACTOR

TECHNICAL FIELD

The present invention relates to the field of contamination removal in reactors. In particular, the invention relates to a cleaning process for treatment chambers, especially vacuum deposition chambers for forming photovoltaic devices.

BACKGROUND ART

Photovoltaic devices, or solar cells, respectively, are devices which convert light, especially sunlight, into electric energy. For low-cost mass production, thin film solar cells are of interest since they allow using glass, glass ceramics or other rigid or flexible substrates instead of crystalline or polycrystalline silicon as a base material, or substrate, respectively. With respect to thin-film solar cells, a sequence of thin, partially doped silicon or silicon alloy films may be arranged, sandwiched between transparent conductive electrodes on a carrier substrate, for example glass, plastic, or steel.

Various solar cell technologies are commercially available today. The possibility to process such cells at low temperatures and in a large scale is a major advantage of this technology.

The solar cell structure, or the layer sequence, respectively, is responsible for or capable of the photovoltaic effect. The layers may be deposited, as thin layers by means of known vacuum deposition techniques such as PVD, CVD, PECVD, and/or APCVD, all of which may be used in semiconductor technology.

Conventional thin-film solar cells usually comprise a transparent electrode layer, also called front electrode, deposited on a substrate. On top of this first electrode layer, a photoelectric conversion semiconductor layer formed of a thin amorphous and/or microcrystalline silicon film and a back electrode layer are usually deposited. Said back electrode may again comprise a transparent conductive layer as well as a reflector layer, a conductive and reflective metal layer or a technical equivalent thereof.

In detail, prior Art FIG. 1 shows a basic, simple photovoltaic cell 10 comprising a transparent substrate 12, with a layer of a transparent conductive oxide (TCO) 14, for example formed of zinc oxide (ZnO), or tin oxide ($SnO_2$), deposited thereon. This layer is also called front contact and acts as first electrode for the photovoltaic element. The combination of substrate 12 and front contact 14 is also known as superstrate. The next layer 16 acts as the active photovoltaic layer and exhibits three "sub-layers" forming a p-i-n junction. Said layer 16 comprises hydrogenated microcrystalline, nanocrystalline or amorphous silicon or a combination thereof. Sublayer 18, which is arranged adjacent to the TCO front contact 14, is positively doped, the adjacent sub-layer 20 is intrinsic, and the final sub-layer 22 is negatively doped. In an alternative embodiment, the layer sequence p-i-n as described can be inverted to n-i-p. In this case, layer 16 is identified as n-layer, layer 20 again as intrinsic, layer 22 as p-layer.

Finally, the cell includes a rear contact layer 24, which also is called back contact. Additionally, a reflective layer 26 is provided. Alternatively a metallic back contact may be realized, which can combine the physical properties of back reflector 26 and back contact 24. For illustrative purposes, arrows indicate impinging light.

Zinc oxide, which may preferably be deposited by low pressure CVD (LPCVD), is widely used for front and back contacts due to the fact that it exhibits outstanding properties in terms of haze due to its surface roughness. Zinc oxide thus enhances the light trapping properties of a solar cell.

However, zinc (Zn), or additionally comparable metals such as tin (Sn) or indium (In), or the respective oxides also may have a negative effect on the performance of photovoltaic modules. In detail, during deposition of subsequent silicon layers by PECVD, for example, it is difficult to avoid reduction of the oxygen compounds of zinc, tin or indium by the PECVD hydrogen plasma. Generally, this effect may appear at all metal-oxide compounds usable for front contacts.

This disadvantage is mainly caused by the fact that hydrogen is commonly used in plasma assisted deposition of silicon. In the case of the widely used zinc oxide, for example, zinc is then in some cases deposited and thus stored at the interior of the reactor, i.e. in its chamber, such as on the walls or on other components of the reactor. It thus forms contamination at the interior of the reactor. Zinc or the aforementioned metals as well as their oxides stored in the reactor will then slowly be released during subsequent deposition steps due to the comparatively large vapour pressure. Due to this slow release of the contaminants during deposition of silicon, the contaminants, or the contamination, respectively, are embedded in the deposited silicon layers resulting in the module performance of the so formed photovoltaic cell being reduced.

It is thus required to remove the contamination from the interior of the reactor, i.e. the reactor chamber. In detail, a method to remove contamination from the reactor, or its interior, respectively, would allow improving the efficiency and the light stability of solar cells formed in the reactor.

Known methods to remove a contaminant, such as zinc, usually involve opening the contaminated reactor and cleaning the interior surfaces with cleaning agents, solvents or other chemical compounds. Such solutions are time consuming and expensive.

A further possible way to reduce the amount of zinc accumulated in a reactor involves depositing solar cells on glass without a TCO front contact and throwing away the glasses. This process, however, is effective but costly and time consuming.

DISCLOSURE OF INVENTION

It is an object of the present invention to provide a method for removing contamination from the interior of a reactor which overcomes at least one of the deficiencies as set forth above.

It is a particular object of the present invention to provide a method for removing contamination from the interior of a reactor which is time and thus cost saving.

It is a further particular object of the present invention to provide a method for removing contamination from the interior of a reactor which does not require complex constructions of the reactor.

These objects are achieved by a method according to claim 1. Advantageous and preferred embodiments are given in the dependent claims.

The present invention relates to a method for removing metal and/or metal oxide contamination from the interior of a vacuum coating reactor, the method comprising the steps of:
a) performing an idle coating step by depositing a coating layer, wherein the coating comprises silicon;
b) at least partly removing the deposited coating layer.

According to the invention, the method for removing contamination from the interior of a reactor is based on the finding that incorporation of contaminants, such as zinc, for example, especially into silicon layers, is significantly increased at the beginning of deposition runs, even in the case that subsequent deposition runs are performed. In other words, in terms of contaminant removal, it is more effective to have several cleaning steps, or deposition cycles, respectively, compared to a single time-equivalent deposition step, or cleaning step. It is thus sufficient to perform subsequent deposition steps, or coating steps, respectively, thereby applying a rather thin coating layer. Due to the above, the contaminants will be embedded into the deposited coating layer in a high amount thereby being removed from the interior of the reactor.

The method according to the invention applies idle coating steps. According to the invention, idle coating steps shall mean that these coating steps, or deposition steps, respectively, are not used for deliberately coat a substrate in order to form or produce a desired product, for example a photovoltaic cell, but this coating step is solely used in terms of contaminant removal.

This idle coating step may thus result in at least regions of the interior of the reactor being coated with a coating layer, for example silicon. In order to finish the method according to the invention, or to apply a number of coating cycles, or cleaning cycles, respectively, the coating layer has to be removed from the reactor before starting a new cycle.

An advantage of the method according to the present invention can be seen in the fact that that no modification of an existing reactor is necessary. In contrast thereto, the reactor may be subjected to the method according to the invention between two production cycles without essential preparations. Additionally, only existing working gases like silane or alike may be used as well as self-cleaning equipment like internal plasma or RPS sources (Remote Plasma Source) with common cleaning gases.

Additionally, the method according to the invention is time saving and thus cost saving allowing the production of photovoltaic cells, for example, being realized much more efficient.

The present invention thus addresses an approach for removing contaminations, such as zinc contaminations, from the interior of a reactor. Said method is less expensive and less time consuming than known methods according to the prior art. It will significantly reduce contaminations, such as zinc contaminations, in a reactor.

The method for removing contamination according to the invention may comprise a series of process steps performed with the release contaminants by means of a plasma with hydrogen and to bind or encapsulate the contaminants into thin deposited coating layers, such as silicon layers. A subsequent plasma assisted cleaning step allows pumping out the silicon together with the zinc or zinc compounds, for example.

In a preferred embodiment of the present invention, steps a) and b) are performed in successive cycles. Due to the fact that the introduction of contaminants into the deposited coating layer, the method according to the invention is particularly effective when applying a number of cycles. It may be preferred that the cycles are performed in a range of 10-20 times to get sufficient results. However, it may be sufficient to repeat the cycle for 5 to 10 times.

In a further preferred embodiment of the present invention, the coating layer is deposited up to a thickness in the range of 20-80 nm, in particular of 25-60 nm, especially preferred in the range of 30-50 nm. This allows the method according to the invention to be performed in a limited time thus being especially time saving and thus cost saving. Additionally, such a thin layer may be sufficient due to the fact that most of the contaminants are introduced into the coating layer at the very beginning stage of the coating process. Thus, a layer having the aforementioned thickness is sufficient to remove a large amount of the contaminants. Additionally, only few coating material is used, making the method according to the invention additionally cost-saving.

In a further preferred embodiment of the present invention, the method comprises the further step of introducing a dummy substrate into the reactor for depositing the coating layer on said dummy substrate. By introducing a dummy substrate into the reactor, the deposition or coating may be performed not to the interior of the reactor, i.e. at the inner walls of the latter, for example, but the dummy substrate is coated instead. This reduces the requirement of the reactor to be cleaned after a cleaning cycle.

The dummy substrate may be any substrate which is appropriate for being coated with the respective substance. As an example, a glass substrate may be used as dummy substrate.

With this regard, it may be preferred that the method comprises the further step of removing the coated dummy substrate from the reactor between two cycles in order to clean the dummy substrate. The dummy substrate itself may thus be cleaned outside the reactor and independently of subsequent cleaning steps. The cleaning may be performed by wet etching at atmosphere, for example, after which the dummy sheet may be reused in the subsequent cycle.

It is furthermore preferred that the method comprises the further step of verifying the level of contamination in the reactor. This allows deciding if further cleaning cycles have to follow, or if the contamination is removed completely, or at least to a sufficient degree. Consequently, this embodiment enables the amount of time as well as coating material being required to perform the method according to the invention to be minimized leading to especially effective and cost-saving conditions.

With respect to the deposited coating layer, it is preferred that the layer comprises silicon, in particular a-Si and/or μc-Si. By depositing the aforementioned layer, the contaminations, such as zinc or zinc oxide, may be removed especially effective.

With this regard, it may be preferred that a deposition a-Si and μc-Si is performed successively. This embodiment is especially preferred if the reactor is contaminated with more than one contaminant. As an example, the reactor may be contaminated with both zinc, and zinc oxide. By performing a method like described above, the remains of contaminants may be removed very efficiently.

In a further preferred embodiment of the present invention, the method comprises the further step of defining a time interval for applying the method according to the invention. This allows the method according to the invention to be performed only in case it is strictly necessary. Therefore, undesired and inappropriate shut down times of the reactor resulting in high costs may be omitted. Additionally, the user exactly knows when a cleaning cycle will be performed, which in turn improves the planning of production cycles by using the reactor.

In a still further preferred embodiment of the present invention, the method is carried out with a maximum temperature of 250° C. In an alternative embodiment, the method is carried out with a maximum temperature of 300° C. Generally, it is preferred that one does not go below this temperature due to the fact that the removal of the contaminants is at least partly dependent from the vapour pressure which in turn may be varied by adjusting the temperature.

In a still further preferred embodiment of the present invention, the method comprises the further step of performing a final cleaning step of the reactor. The final cleaning step of the reactor enables to remove all remains of the deposited coating layer potentially being present at the interior of the reactor. The difference with respect to a "normal" cleaning step (step b)) is mainly determined by the duration, which may preferably be 2 to 5 times longer compared to step b).

In a further preferred embodiment of the present invention, a plasma deposition reactor, in particular a plasma enhanced chemical vapour deposition (PECVD) reactor is used. The method according to the invention is especially effective for cleaning such a reactor.

In a still further preferred embodiment of the present invention, the contamination comprises a metal and/or a metal oxide, in particular zinc, tin, indium, and/or zinc oxide, tin oxide, indium oxide.

It is still further preferred that the method is performed in relation to the production of a photovoltaic cell. The invention described herein is applicable to the formation of any kind of thin film solar cells to the extent problems as described do occur. It may refer to silicon as well as other semiconductor-based single junction p-i-n cells as well as stacked multi junction cells, such as tandem, triple junction etc.

BRIEF DESCRIPTION OF DRAWINGS

These and other aspects of the invention will be apparent from and elucidated with reference to the embodiments described hereinafter.

In the drawings.

DETAILED DESCRIPTION OF DRAWINGS

In the following, the method according to the invention is described. It is particularly suitable for removing contaminants from the interior of a reactor and thus for cleaning the reactor.

The contamination mainly comprises a precursor being used in the reactor in order to produce a desired product. Such contaminations mainly are formed of solid material, in detail metallic compounds or metal oxides, such as zinc, tin, indium, or the respective oxides being formed during normal operation of the reactor.

According to this, the reactor may be any reactor particularly using a substance to coat a substrate. As an example, the reactor may be a coating, or deposition reactor. In detail, the reactor may comprise a vapour deposition module. The deposition may take place under atmospheric or vacuum conditions. Preferably the module is a chemical vapour deposition (CVD) or physical vapour deposition (PVD) module. More preferably, the module is a plasma enhanced CVD (PECVD), an atmospheric pressure CVD (APCVD) and/or a metal-organic CVD (MOCVD) module. In another preferred embodiment the module is used for thin film deposition, more preferably for zinc oxide thin film deposition. In another embodiment of the invention the reactor contains ≥1 module.

Especially, the reactor may be used for the production of photovoltaic devices, photoelectric conversion devices, solar cells, and/or semiconductors. In a preferred example, the reactor is a large-scale and/or industrial size reactor, as such systems of bigger size produce greater amounts of contaminations and are highly dependent on the proper disposal of such contaminations. Furthermore, with such reactors of bigger size even the smallest amount of time in which they are not used for the desired process, unused capacities will occur leading to the generation of extremely high costs.

Like stated above, the method according to the invention is based on the finding that the removal of contaminants is especially effective at early stages of a coating process, or deposition process, respectively. This effect is shown in FIG. 2.

Figure 1:
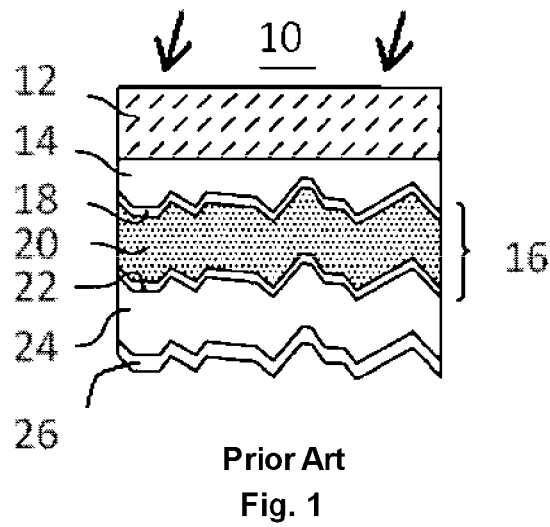
FIG. 1 schematically shows a common design of a simple thin film solar cell according to the state of the art.
Figure 2:
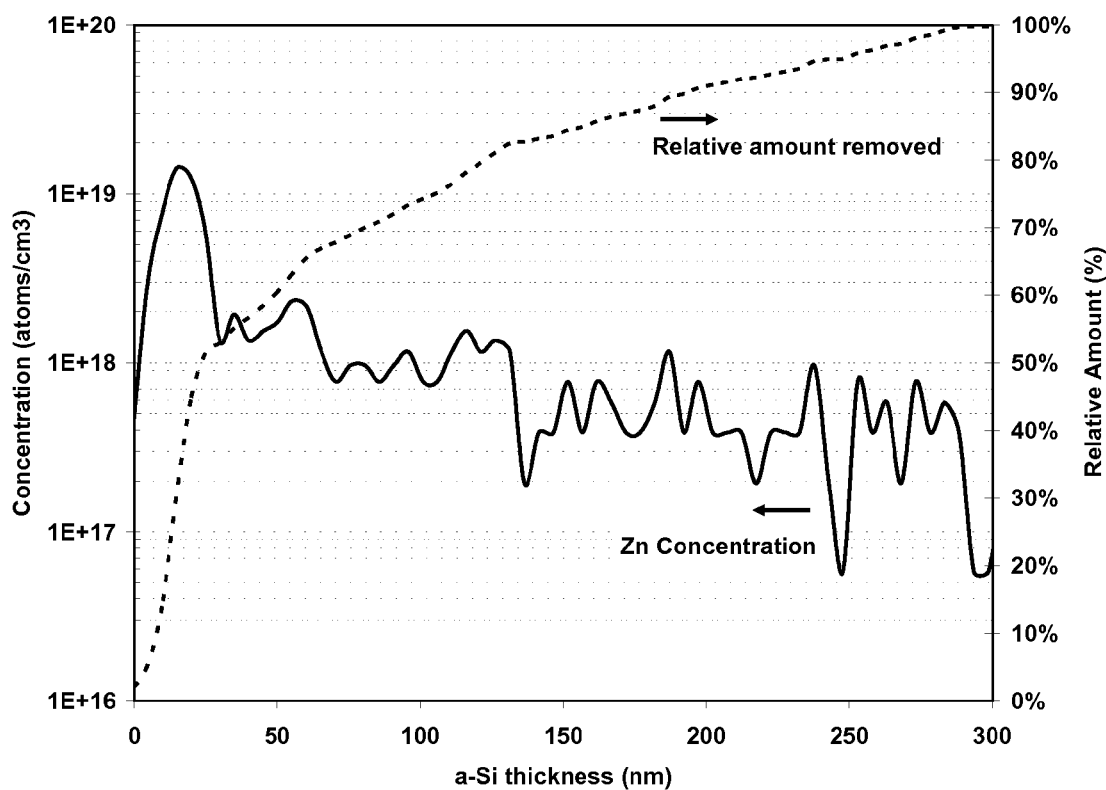
FIG. 2 schematically shows a diagram showing the zinc concentration across a 300 nm thick a-Si layer deposited on glass without front contact.

In detail, FIG. 2 shows a Secondary Ions Mass Spectrometry (SIMS) measurement displaying the zinc concentration (continuous line) across a 300 nm thick a-Si layer deposited on a glass substrate without front contact. The deposition has taken place in a zinc contaminated PECVD reactor. According to FIG. 2, the x axis shows the thickness of the silicon layer. In detail, the left side of the x-axis corresponds to the concentration at the beginning of the deposition process, i.e. close to the glass substrate; the right side of the x-axis corresponds to the concentration at the end of the deposition process and thus to the surface of the a-Si layer. The amount of zinc contained in within a certain thickness relative to the total amount released during a typical deposition process is shown by the dashed line. According to the measurement shown in FIG. 2, the zinc originates only from the contaminated reactor because no front contact was used. It can clearly be seen that about 60% of the zinc being removed from the interior of the reactor is contained in the first 50 nm of the silicon layer and was thus introduced in said layer at the beginning stage of the deposition process. At thicknesses lying above 50 nm, only a minor increase of relative amount of zinc removed from the reactor can be seen.

According to the invention it is thus sufficient to deposit a coating layer with only a small thickness to remove a big amount of the contaminants being present at the interior of the reactor. In detail, a thickness in the range of 20-80 nm, in particular of 25-60 nm, especially preferred in the range of 30-50 nm may be sufficient.

A preferred embodiment of the present invention will now be described. This embodiment will be referred to as embodiment A.

According to embodiment A, the method according to the invention comprises the following steps:

1.) Introducing a dummy substrate into the reactor. The dummy substrate may for example be a glass substrate, whereas the reactor may be a PECVD reactor. The dummy sheet is introduced in order to deposit the coating layer according to the next step thereon.

2.) Depositing a silicon layer of a thickness between 20-80 nm, preferably 25-60 nm, especially preferred 30-50 nm. The layer may be either a-Si or µc-Si and it should be intrinsic. Doped silicon forming the deposited coating layer may be used as well; however, it is not necessary and may increase the gas consumption. The choice between an a-Si or a µc-Si layer depends on the contamination of the reactor, as will be apparent down below. The optimal thickness of the deposited coating layer is a tradeoff between the amount of contaminant, such as zinc, to be removed, or in other words the degree of contamination, and the time necessary for coating the layer. Having reached a thickness of the layer of approximately 30 nm, the amount of zinc being introduced into said layer reaches the maximum concentration. A reasonable increase of the total amount of zinc removed from the reactor can be achieved by depositing a layer having a thickness of up to 80 nm (see FIG. 2). A further increase of the thickness does not significantly improve the amount of zinc being removed from the reactor.

3.) Removing the dummy substrate from the reactor. The dummy substrate may then be cleaned outside the reactor and independently of subsequent cleaning steps. For example, wet etching at atmosphere may be applied for cleaning the dummy substrate, and the latter may be reused in a later deposition step, or cleaning cycle, respectively. With regard to step 3.), the contamination being encapsulated in the silicon layer on the preferably large surface of the dummy substrate is being removed from the reactor as a whole.

In step 4.), the remaining silicon layer in the reactor, or the reactor chamber, respectively, is removed by standard cleaning procedures based on $NF_3$, $SF_6$ or $F_2$ gas, for example. The duration of the cleaning procedure should be chosen to remove the silicon deposited in step 2.).

With respect to further step 5.), steps 1 to 4 may be repeated several times in order to ensure that all of the contaminations being present inside the reactor are removed. For example, a repetition for 10 to 20 times may be appropriate.

In order to finish the method according to the invention, with regard to step 6.), a final cleaning step may be performed. This final cleaning step may be adjusted to be preferably 2-5 times longer compared to step 4.). In case a plasma etching process is used, the plasma etching power is assumed to be constant and comparable to step 4.).

In a further embodiment of the present invention, which is referred to as embodiment B, the dummy substrate is not removed in step 3.) of embodiment A. Even though a cleaning step of the dummy sheet may be advantageous, in case the dummy sheet is not removed, the latter will be cleaned together with reactor, or its chamber, respectively. This embodiment may thus save time, since no handling for the dummy substrate is required. A process flow in this case may be as follows:

1.) As above, embodiment A.
2.) As above, embodiment A.
3.) Omitted.
4.) As above, embodiment A.
5.) As above, embodiment A.
6.) As above, embodiment A.

In a still further embodiment of the present invention, which will be referred to as embodiment C, no dummy substrate is used at all. The deposition is thus performed without dummy substrate and thus with an empty reactor. A process flow in this case may be as follows:

1.) Omitted.
2.) As above, embodiment A.
3.) Omitted.
4.) As above, embodiment A.
5.) As above, embodiment A.
6.) As above, embodiment A.

All embodiments A, B, and C as described above may be varied according to the following:

I) Skipping the final cleaning step (step 6.)). This is possible due to the fact that the final cleaning step has the main purpose to remove silicon but it has minor influence on other contamination, such as zinc. Therefore, a minor amount of silicon being present in the reactor chamber will not deteriorate the properties of the products formed in the reactor, such as photovoltaic cells.

II) Investigating a deposition of the coating layer to verify the performance level. In other words, the level of zinc contamination may be verified for example by SIMS or related techniques as shown in FIG. 2.

Quicker results may be obtained by monitoring the solar cell performance, i.e. the performance of the solar cell formed in the reactor.

Figure 3:
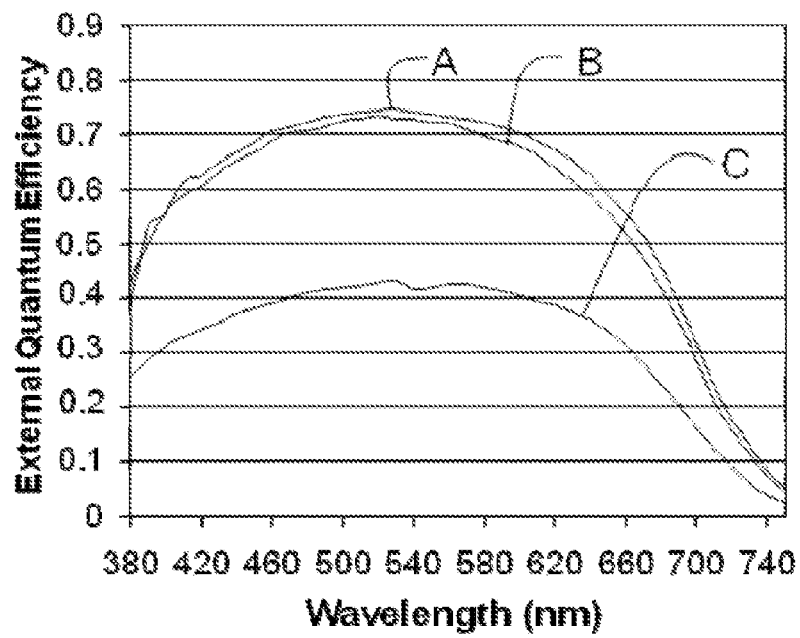
FIG. 3 schematically shows a diagram showing the effect of zinc contamination on the external quantum efficiency of a single junction a-Si cell at 0.7V bias voltage.

This may be realized by external quantum efficiency (EQE) measurements, for example. This is shown in FIG. 3, in which a diagram showing the effect of zinc contamination on the external quantum efficiency of a single junction a-Si cell at 0.7V bias voltage is shown. In case of amorphous silicon solar cells to be formed, a symptom of zinc contamination observable in EQE curves is an overall decrease of EQE at a bias voltage of e.g. 0.7V.

Figure 4:
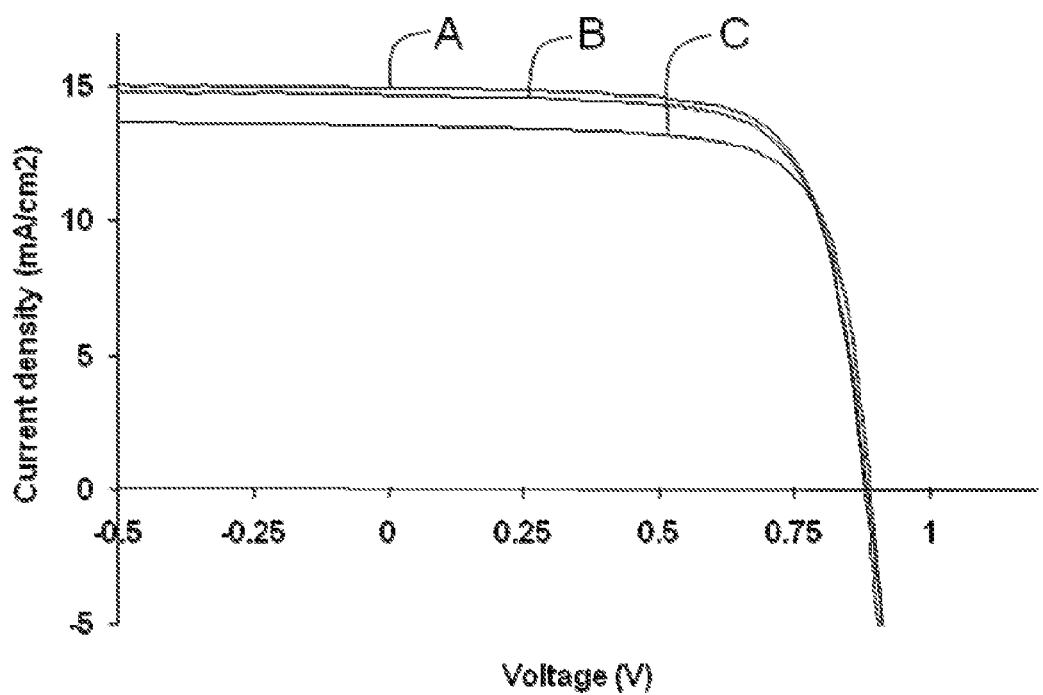
FIG. 4 schematically shows a diagram showing the effect of zinc contamination on the Current-Voltage (IV) characteristic of a single junction a-Si cell.

Additionally, the solar cell performance may be monitored by measuring the Current-Voltage characteristic of a produced solar cell. This is shown in FIG. 4, in which a diagram showing the effect of zinc contamination on the Current-Voltage (IV) characteristic of a single junction a-Si cell is shown. In IV curves, a loss of fill factor is often related to zinc contamination.

In FIGS. 3 and 4, a comparison of a clean system, or reactor, is shown (see curve A, respectively) in comparison with a reactor exhibiting minor contaminations (see curve B, respectively) and heavy contamination (see curve C, respectively). FIGS. 3 and 4 are examples measured in single junction amorphous silicon solar cells. Depending on the solar cell material and structure (single or multiple junctions) the measurement settings and results will be different. Depending on the result the repeat rate of steps 1.)-4.) may be increased or lowered.

The values given above have been found to be suitable for a PECVD system with a parallel plate reactor plus additional RPS (remote plasma source) support. The plasma power delivered by the parallel plates amounts to maximal 0.3 $W/cm^2$. It is thus clear, that the method according to the invention can be applied to other, similar systems by varying the process parameters accordingly without leaving the scope of the invention: Focusing on the most effective 20-80 nm silicon deposition to collect the zinc contaminants.

Whether a deposition of a-Si or µc-Si is chosen for the above identified step 2.) may depend on the amount of hydrogen gas and on the power used for the deposition process, for example. Usually, µc-Si requires much larger flows of hydrogen gas and larger power, or power densities, respectively, compared to a-Si. Under such process conditions, hydrogen molecules are dissociated in the plasma to atomic hydrogen. Zinc oxide is thus reduced by atomic hydrogen to zinc, and the oxygen is later removed as water.

If it is expected that the reactor is contaminated by more than one contaminant, for example not only by metallic zinc but by zinc oxide remnants too, for example by attaching zinc oxide powder to the backside of the glasses with front contacts, it may be useful to perform a deposition of µc-Si. In this case the zinc oxide will be reduced and it can be removed by the deposition procedure.

In a further example of the method according to the invention, only a few µc-Si depositions are being performed followed by a subsequent check of cell performance to avoid releasing much more zinc than the amount which can be removed in a reasonable time by using the procedure.

In case the reactor is heavily contaminated with both zinc and zinc oxide, for example, the following embodiment according the invention is preferred, which is referred to as embodiment D. In the following embodiment, a deposition, or a coating step, respectively, is performed successively by using a-Si and μc-Si. As process flow according to embodiment D may thus be follows.

1.) Introducing a dummy substrate, for example formed of glass, into the reactor, such as a PECVD reactor,
2.) Performing one μc-Si deposition to achieve a thickness in the range of 25-80 nm, for example.
3.) Removing the dummy substrate from the reactor as in step 3.) of embodiment A.
4.) Removing the deposited silicon by performing a cleaning procedure, which is similar to step 4.) of embodiment A. The cleaning procedure should be adapted to completely remove the deposited μc-Si.
5.) Introducing, or re-introducing a dummy substrate, for example formed of glass, into the reactor,
6.) Performing an a-Si deposition as described in step 2.) of embodiment A.
7.) Removing the dummy substrate from the reactor as in step 3.) of embodiment A.
8.) Removing the silicon as in step 4.) of embodiment A.
9.) Repeating steps 5.)-8.) for 10 to 20 times.
10.) Perform a final cleaning step as in step 6.) of embodiment A.

In an alternative embodiment of the present invention, which is referred to as embodiment E, the dummy substrate is not removed in steps 3.) and 7.) and consequently not re-introduced in step 5.) compared to embodiment D. It will be cleaned together with the chamber, or the reactor, respectively. This procedure is further time-saving, since no handling for the dummy substrate is necessary. A process flow according to embodiment E may thus be follows.

1.) As above, embodiment D.
2.) As above, embodiment D.
3.) Omitted.
4.) As above, embodiment D.
5.) Omitted.
6.) As above, embodiment D.
7.) Omitted.
8.) As above, embodiment D.
9.) As above, embodiment D.
10.) As above, embodiment D.

In a further embodiment, which is referred to as embodiment F, no dummy substrate will be used at all. The deposition step is thus performed in an empty reactor chamber. The process flow according to embodiment F may thus be follows.

1.) Omitted.
2.) As above, embodiment D.
3.) Omitted.
4.) As above, embodiment D.
5.) Omitted.
6.) As above, embodiment D.
7.) Omitted.
8.) As above, embodiment D.
9.) As above, embodiment D.
10.) As above, embodiment D.

The three embodiments D-F can be varied with the following process steps.

I) Optionally skipping the additional cleaning step 10.
II) Investigating a deposited layer to verify performance level, or in other words to check the level of zinc contamination.
III) Repeating embodiments D-F until desired performance is reached based on the results of b).

The efficiency of all embodiments of the method according to the invention described herein can be improved by increasing the temperature of the reactor, such as the PECVD reactor, compared to the temperature used for production of solar cells. This may be explained due to the fact that by increasing the temperature, the vapour pressure of the contaminants, such as metallic zinc, for example, is increased and therefore the release rate from the interior of the reactor is increased. Consequently, increasing the temperature leads to an increase of the amount of zinc removed by each step. It is thus especially preferred, that the method according to the invention is performed with a maximum temperature of 250° C.

A further embodiment of the present invention, which is referred to as embodiment G, may prevent the accumulation of contamination such as zinc and is preferably used on a regular basis, i.e. daily or weekly, to limit the amount of contamination accumulated in the reactor. This may help avoiding the effort for a cleaning according to the state of the art to further extend the interval between embodiments A-F as described above. For this purpose the following process can be used.

1.) Defining a time interval for performing a contamination removal process. Possible intervals may correspond to a few deposition cycles, i.e. every 3 to 10 times, for example, if extremely low contamination is desired. In contrast thereto, the time interval may be set to a defined time range, for example a few weeks. The time interval may depend on the amount of depositions performed, on the amount of contaminant released in each deposition, on the sensitivity of the solar cells to zinc, for example, and on other factors.
2.) Introducing a dummy substrate, as in step 1.) of embodiment A.
3.) Depositing a-Si, as in step 2.) of embodiment A.
4.) Removing the dummy substrate, as in step 3.) of embodiment A.
5.) Cleaning the reactor to remove the deposited coating layer, as in step 4.) of embodiment A.
6.) Repeating steps 2-5 up to 10 times, depending on the interval defined is step 1. It may enough to perform steps 1 and 2 just once.

In an alternative embodiment which is referred to as embodiment H, it is possible that the dummy substrate, or the glass, respectively, remains in the reactor. The process flow according to embodiment H may thus be as follows.

1.) As above, embodiment G.
2.) As above, embodiment G.
3.) As above, embodiment G.
4.) Omitted.
5.) As above, embodiment G.
6.) As above, embodiment G.

In an additional embodiment, the glass, i.e. the dummy substrate, may be completely omitted. The process flow may thus be follows.

1.) As above, embodiment G.
2.) Omitted.
3.) As above, embodiment G.
4.) Omitted.
5.) As above, embodiment G.
6.) As above, embodiment G.

Optionally performing a longer cleaning procedure (step 5.)) or a final cleaning step can be of advantage. Afterwards normal production by using the cleaned reactor can be continued.

While the invention has been illustrated and described in detail in the drawings and foregoing description, such illustration and description are to be considered illustrative or exemplary and not restrictive; the invention is not limited to the disclosed embodiments. Other variations to be disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting scope.

REFERENCE SIGN LIST 10 photovoltaic cell
12 transparent substrate
14 transparent conductive oxide
16 next layer
18 sub-layer
20 adjacent sub-layer
22 final sub-layer
24 rear contact layer
26 reflective layer

The invention claimed is:

1. A method for removing metal and/or metal oxide contamination from the interior of a vacuum coating reactor, the method comprising:
  a plurality of successively performed consecutive deposition cycles, each of the deposition cycles comprising the steps of:
    a) performing an idle coating step by depositing a coating layer comprising silicon, the silicon comprising a-Si and µc-Si, a deposition of a-Si and µc-Si being performed successively, the coating layer being deposited up to a thickness within a range of 30 nm to 50 nm; and
    b) at least partly removing the deposited coating layer.

2. The method according to claim 1, further comprising the step of introducing a dummy substrate into the reactor for depositing the coating layer on said dummy substrate.

3. The method according to claim 2, further comprising the step of removing the coated dummy substrate from the reactor between the performing step and the partly removing step in order to clean the dummy substrate.

4. The method according to claim 1, further comprising the step of verifying the level of contamination in the reactor.

5. The method according to claim 1, further comprising the step of defining a time interval for the performing of the idle coating step and the at least partly removing of the deposited coating layer.

6. The method according to claim 1, wherein the method is carried out with a maximum temperature of 250° C.

7. The method according to claim 1, further comprising the step of performing a final cleaning step of the reactor.

8. The method according to claim 1, wherein the reactor is a plasma deposition reactor.

9. The method according to claim 1, wherein the contamination comprises zinc, tin, indium, and/or zinc oxide, tin oxide, indium oxide.

10. The method according to claim 1, wherein the method is performed in relation to production of a photovoltaic cell.

11. The method according to claim 1, wherein the reactor is a PECVD reactor.

* * * * *